United States Patent [19]

Hara et al.

[11] Patent Number: 5,194,762
[45] Date of Patent: Mar. 16, 1993

[54] MOS-TYPE CHARGING CIRCUIT

[75] Inventors: Takahiko Hara; Syuso Fujii, both of Kawasaki; Shigeyoshi Watanabe, Yokohama, all of Japan

[73] Assignee: Kabushiki Kaisha Toshiba, Kawasaki, Japan

[21] Appl. No.: 498,622

[22] Filed: Mar. 26, 1990

[30] Foreign Application Priority Data

Mar. 30, 1989 [JP] Japan .................................... 1-79406

[51] Int. Cl.$^5$ ......................... H03K 3/01; H03K 3/26; H03K 17/687; G05F 3/16
[52] U.S. Cl. ............................... 307/296.8; 307/270; 307/571; 307/246; 307/584; 323/284; 323/315
[58] Field of Search .................. 307/296.5, 270, 296.6, 307/296.8, 296.1, 246, 571, 475, 584; 323/315, 316, 317, 284

[56] References Cited

U.S. PATENT DOCUMENTS

| | | | |
|---|---|---|---|
| 4,692,689 | 9/1987 | Takemae | 307/296.8 X |
| 4,716,307 | 12/1987 | Aoyama | 307/296.8 |
| 4,716,313 | 12/1987 | Hori et al. | 307/296.8 X |
| 4,803,612 | 2/1989 | Skovmand | 307/270 X |
| 4,897,565 | 1/1990 | Shimizu | 307/475 X |
| 4,928,053 | 5/1990 | Sicard et al. | 307/571 X |
| 4,937,469 | 6/1990 | Larson et al. | 307/270 |
| 4,952,827 | 8/1990 | Leipold et al. | 307/571 |
| 4,970,420 | 11/1990 | Billings | 307/571 |
| 4,988,888 | 1/1991 | Hirose et al. | 307/246 X |

Primary Examiner—Edward P. Westin
Assistant Examiner—Andrew Sanders
Attorney, Agent, or Firm—Finnegan, Henderson, Farbow, Garrett and Dunner

[57] ABSTRACT

In a MOS-type charging circuit in a semiconductor chip using a supply voltage-lowering circuit, a driver MOS transistor is connected not to an output of the supply voltage-lowering circuit but directly to an external power supply. A comparison is made between the voltage at the terminal of the driver MOS transistor connected to a large-capacity capacity load and an output of the supply voltage-lowering circuit, i.e., an internal supply voltage of the chip. On the basis of the result of comparison, the gate potential of the driver MOS transistor is controlled, and the large-capacity load is charged to the level of the internal supply voltage of the chip. Hence, only one driver transistor can be used as conventionally required two driver transistors connecting the external power supply and the large-capacity load, so that the chip area can be reduced. In addition, since the large-capacity load is directly connected to the external power supply, it is possible to stably maintain the operation of the supply voltage-lowering circuit and the potential of the internal supply voltage which is its output. Hence, it is possible to prevent the malfunctioning of the chip and a decline in the operating margin due to fluctuations in the internal supply voltage. Since a control circuit can be deactivated upon completion of charging the large-capacity load, a reduction in power consumption can be attained.

19 Claims, 9 Drawing Sheets

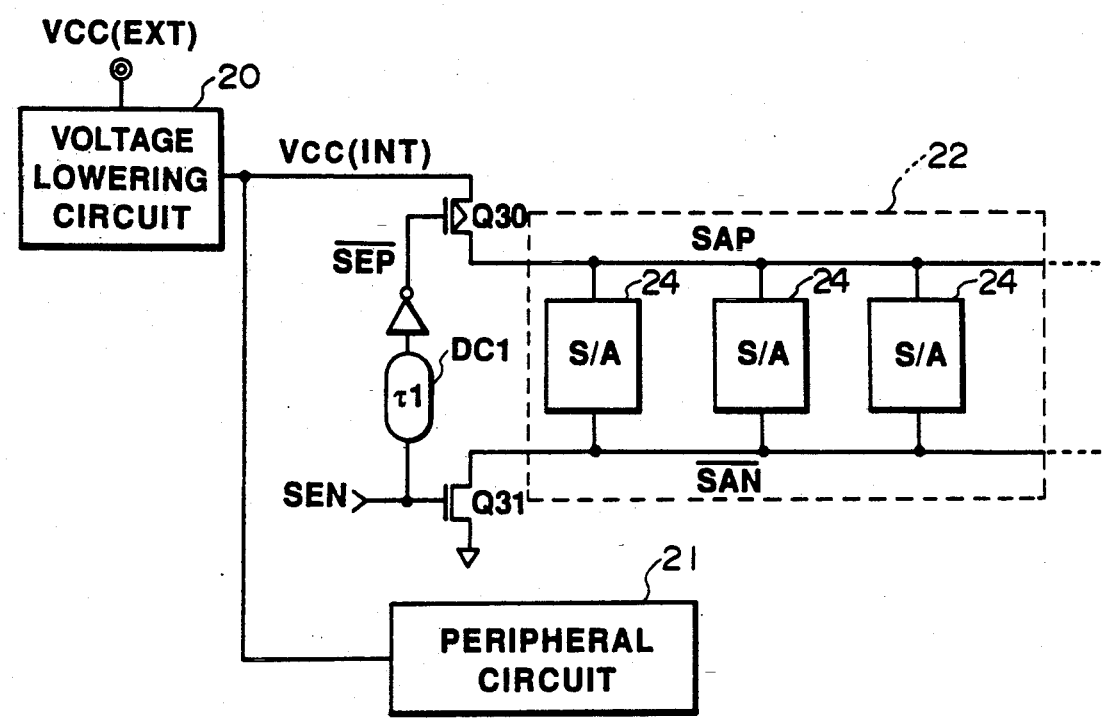
FIG. 7(a) *(PRIOR ART)*
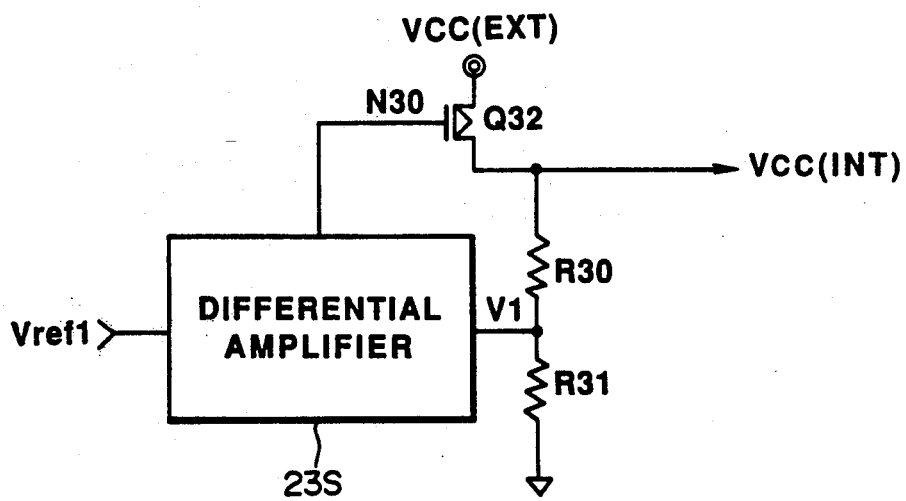
FIG. 7(b) *(PRIOR ART)*

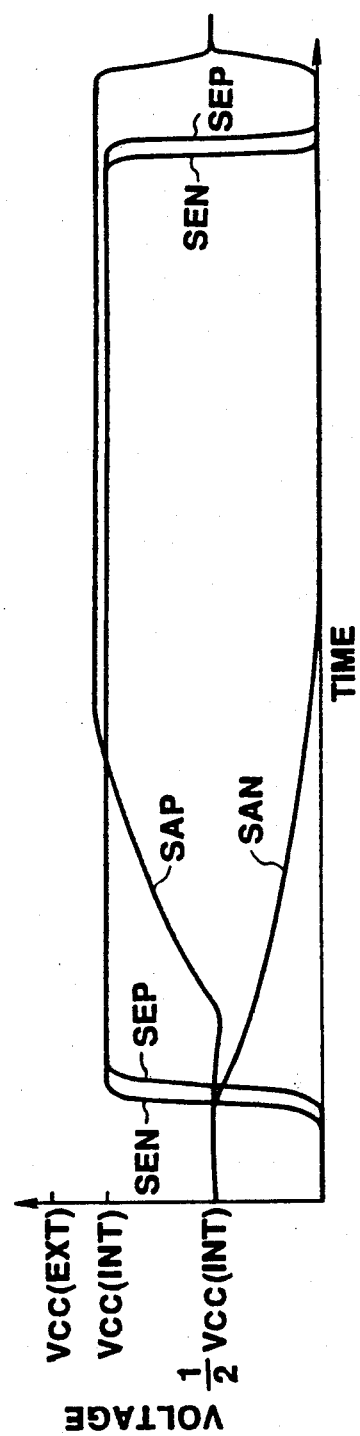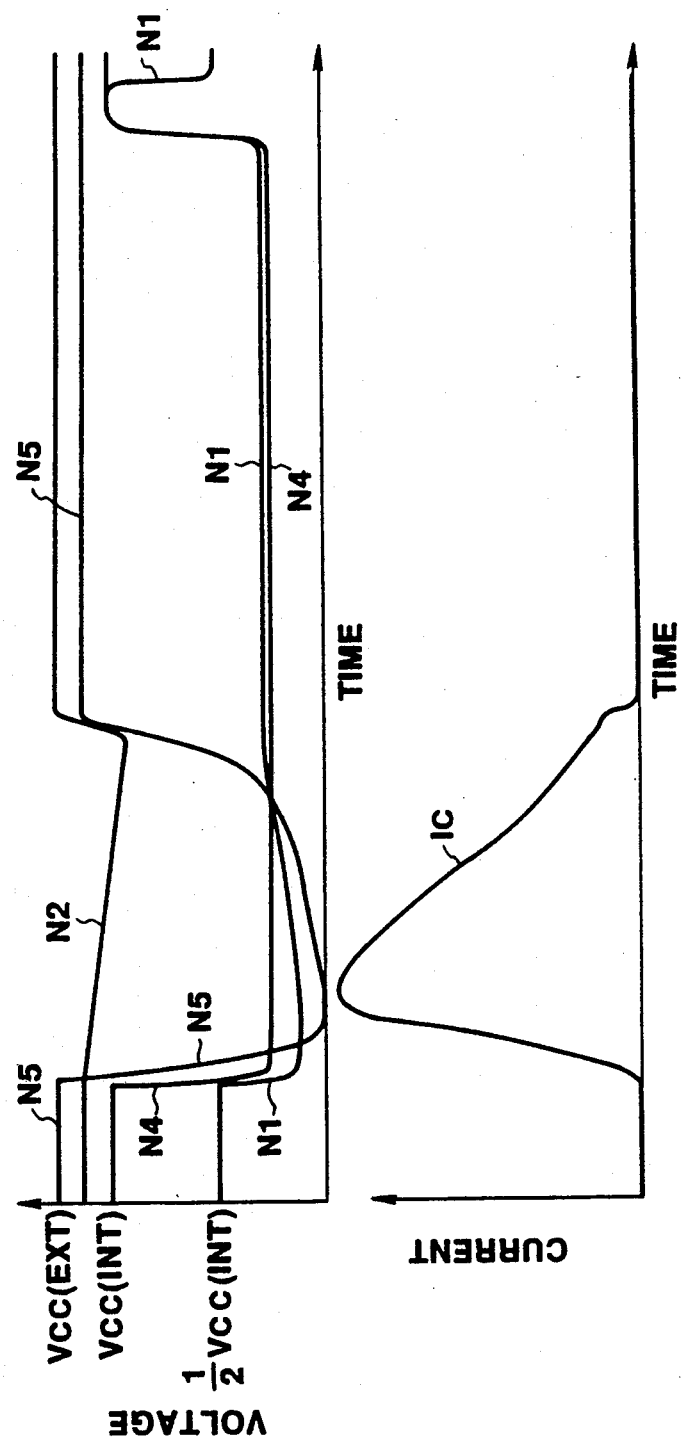
FIG.8(a)
FIG.8(b)
FIG.8(c)

MOS-TYPE CHARGING CIRCUIT

BACKGROUND OF THE INVENTION

1. Field of the Invention

The present invention relates to a MOS-type charging circuit, and more particularly to a MOS-type charging circuit for charging a large-capacity load in a semiconductor chip having a supply voltage-lowering circuit for converting inside the semiconductor chip an external supply voltage applied from a power supply outside the semiconductor chip to an internal supply voltage which is lower than the external supply voltage.

2. Description of the Related Art

In recent years, in conjunction with the development of semiconductor technology, particularly the development of fine pattern technology, the tendency toward an ever-finer pattern has become more and more pronounced in the field of semiconductor memories as well. For this reason, in view of the reliability of the devices, it is desirable to lower supply voltages that are applied to the devices.

However, for the users who have configured various systems by using semiconductor memories currently in use, if consideration is given to compatibility with the current systems, it is desirable that even if the degree of integration of the semiconductor memories is further increased, external supply voltages $V_{cc}$ (EXT) applied from outside the chips can be used as they are.

For this reason, development is underway of technology for lowering the voltage applied to the device to a level lower than an external voltage by providing a supply voltage-lowering circuit inside the chip.

In a synchronous-type MOS memory, operations of charging and discharging a large-capacity load inside the chip are frequently carried out. For instance, in charging and discharging operations of a dynamic random-access memory (DRAM), the amount of current itself flowing across each sense amplifier connected to the transistor of each memory cell is small.

In practice, however, there are many cases where, as shown in FIG. 7(a), a load circuit 22 having a multiplicity of sense amplifiers 24 is connected via a driver transistor Q30 to one supply voltage-lowering circuit 20 connected to an external power supply ($V_{cc}$ (EXT)). In such a case, even though the amount of current itself flowing across one sense amplifier 24 may be small, the current flowing across the driver transistor Q30 instantaneously becomes large. Consequently, the operation of the voltage-lowering circuit 20 cannot sufficiently follow the operation of the load circuit 22, so that an internal supply voltage $V_{cc}$ (INT) which is an output of the voltage-lowering circuit 20 becomes temporarily unstable.

As shown in FIG. 7(b), this voltage-lowering circuit 20 comprises a differential amplifier 23s for comparing a potential V1 obtained by dividing the internal supply voltage $V_{cc}$ (INT) of the chip with resistors R30, R31 with a reference potential $V_{refl}$ which is not dependent on the external supply voltage $V_{cc}$ (EXT), and also comprises a p-channel MOS transistor Q32 having a gate terminal connected to an output terminal N30 of the differential amplifier 23s. It is so configured that the voltage of the external power supply ($V_{cc}$ (EXT)) connected to a source terminal of the p-channel MOS transistor Q32 is lowered to a desired voltage of the internal power supply ($V_{cc}$ (INT)). Here, values of the resistors R30, R31 are set in such a manner that the potential V1 obtained by dividing the potential of the internal supply voltage $V_{cc}$ (INT) of the chip with the resistors R30, R31 becomes equal with the reference potential $V_{refl}$.

More specifically, when the power has been consumed by the load circuit 22 inside the chip, including the sense amplifiers 24, and the potential V1 has dropped below the reference potential $V_{refl}$, the p-channel MOS transistor Q32 turns on, and when the internal supply voltage $V_{cc}$ (INT) has reached a design value, the p-channel MOS transistor Q32 turns off, so as to maintain the internal supply voltage $V_{cc}$ (INT) at a constant level.

In addition, an output of the voltage-lowering circuit 20 whose voltage has been lowered to a desired internal supply voltage $V_{cc}$ (INT) is connected to a source terminal of the driver transistor Q30, so that, at the time of sensing, the load circuit 22 is charged up to a desired charging potential (e.g., ⅔ $V_{cc}$ (EXT)) by the driver transistor Q30.

In order to charge the large-capacity load 22 by using an internal circuit thus configured, since a large current flows from the external power supply ($V_{cc}$ (EXT)) through the two p-channel transistors Q30, Q32 connected in series, dimensions of the p-channel transistors Q30, Q32 must be enlarged. Hence, there has been a problem in that this leads to an increase in the chip area.

Meanwhile, the internal power supply ($V_{cc}$ (INT)) also serves as a power supply for a peripheral circuit 21 which is constituted by an address buffer, a decoder, etc. Consequently, as described above, when charging such a large-capacity load, the current flowing across the driver transistor Q30 instantaneously becomes large, so that the operation of the voltage-lowering circuit is unable to sufficiently follow the operation of the load circuit. Hence, when the internal supply voltage $V_{cc}$ (INT), which is the output of the voltage-lowering circuit 20, has become temporarily unstable, the operation of the peripheral circuit 21 is affected substantially, thereby causing a malfunctioning of the memory and a drop in an operational margin.

Furthermore, there has been an additional problem in that when the internal supply voltage $V_{cc}$ (INT) undergoes large fluctuations due to the driving of a large-capacity load, the operation of the voltage-lowering circuit itself becomes unstable.

Thus, with semiconductor chips using conventional supply voltage-lowering circuits, at the time of charging a large-capacity load, the fluctuations of the internal supply ( voltage $V_{cc}$ (INT) inside the chip and an increase in the chip area due to the use of two transistors connected in series have been a major problem in hampering the creation of a fine pattern and the improvement of reliability of the device.

SUMMARY OF THE INVENTION

Accordingly, an object of the present invention is to provide a compact MOS-type charging circuit which makes it possible to charge a large-capacity load up to the potential of an internal power supply without causing fluctuations in the voltage of the internal power supply inside a semiconductor chip using a supply voltage-lowering circuit and which excels in controllability, thereby overcoming the above-described drawbacks of the conventional art.

To this end, in accordance with a first aspect of the invention, there is provided, in a semiconductor chip using a supply voltage-lowering circuit, a MOS-type charging circuit characterized in that a first terminal of a control circuit is connected to a drain terminal of a driver MOS transistor of the charging circuit connected to a load circuit, and a second terminal thereof is connected directly to a terminal of an external power supply of the chip, the control circuit being adapted to compare the voltage at the first terminal with an output of the power supply-lowering circuit, i.e., an internal supply voltage of the chip and, on the basis of the result of this comparison, control the gate potential of the driver MOS transistor and charge the load circuit up to the internal supply voltage of the chip. The MOS-type charging circuit also includes a deactivating circuit for automatically deactivating the control circuit when the potential at the other terminal of the MOS transistor becomes higher than the second potential even when a control signal is being input to the control circuit.

Preferably, the second potential assumes a value slightly lower than the internal supply voltage of the chip.

In addition, the second potential may agree with the internal supply voltage of the chip.

In accordance with a second aspect of the invention, the control circuit is constituted by a differential amplifier, is activated by an input of a control signal thereto, and is adapted to compare the potential at the other terminal of the MOS transistor with a second potential which is lower than that of the first power supply, and the control circuit allows the MOS transistor to be energized and to effect a charging until the potential at the other terminal becomes equal with the second potential when the potential at the other terminal is lower than the second potential, the control circuit including a low-level maintaining circuit for forcedly maintaining an output of the differential amplifier at low level for a fixed time through an input of the control signal thereto.

In accordance with the above-described configuration, since the supply voltage for charging the load circuit is constituted not by the internal supply voltage but by the external supply voltage, it is possible to maintain the internal supply voltage of the chip at a stable level even when a large current flows instantaneously across the load.

Accordingly, it is possible to stably maintain not only the operation of a peripheral circuit but also the operation of the power supply-lowering circuit.

In addition, although two driver transistors have conventionally been required between the external power supply and the load circuit, only one driver transistor can be used, so that it is possible to substantially reduce the chip area.

Furthermore, in accordance with the first aspect of the invention, since the control circuit can be deactivated after the load circuit has been charged, a reduction in power consumption can be attained.

If the second potential is made to agree with the internal supply voltage of the chip, it is possible to effect a charging efficiently until the load circuit is charged to the level of the internal supply voltage.

Preferably, by setting the second potential in such a manner as to assume a value slightly lower than the internal supply voltage of the chip, it is possible to ensure that the actual agreement of the second potential with the internal supply voltage of the chip takes place concurrently with the turning off of the driver MOS transistor, by virtue of the charging during a time lag from the time when the potential of the other terminal of the driver MOS transistor becomes higher than the second potential and it is determined by the control circuit that the load circuit is to be deactivated and until the time when the driver MOS transistor actually turns off. Furthermore, in a commonly employed supply voltage-lowering circuit, the operation is effected such that when the external supply voltage $V_{cc}$ (EXT) is decreased continuously, at a certain voltage or below the value of the internal supply voltage $V_{cc}$ (INT) becomes substantially equal to the external supply voltage $V_{cc}$ (EXT). In this situation, there are cases where the deactivating circuit fails to function properly after the charging of the large-capacity load. In this case, if the second potential is set at a value slightly lower than the internal supply voltage of the chip, even in cases where the value of the internal supply voltage $V_{cc}$ (INT) is substantially equal to the external supply voltage $V_{cc}$ (EXT), the potential at the other terminal of the driver MOS transistor becomes higher than the second potential. Hence, the deactivating circuit can be made to operate favorably.

Moreover, in accordance with the second aspect of the invention, since an output of the differential amplifier is forcedly maintained at low level for a fixed time through an input of a control signal thereto, it is possible to shorten the response time.

BRIEF DESCRIPTION OF THE DRAWINGS

FIG. 7(a) is a block diagram illustrating a configuration of a chip using a conventional MOS-type charging circuit;

FIG. 7(b) is a diagram illustrating a basic configuration of a supply voltage-lowering circuit shown in FIG. 7(a);

FIGS. 8(a) to 8(c) are timing charts of a basic circuit of the MOS-type charging circuit shown in FIG. 2.

DESCRIPTION OF THE PREFERRED EMBODIMENTS

Referring now to the accompanying drawings, a description will be given of the preferred embodiments of the present invention.

Figure 1A:
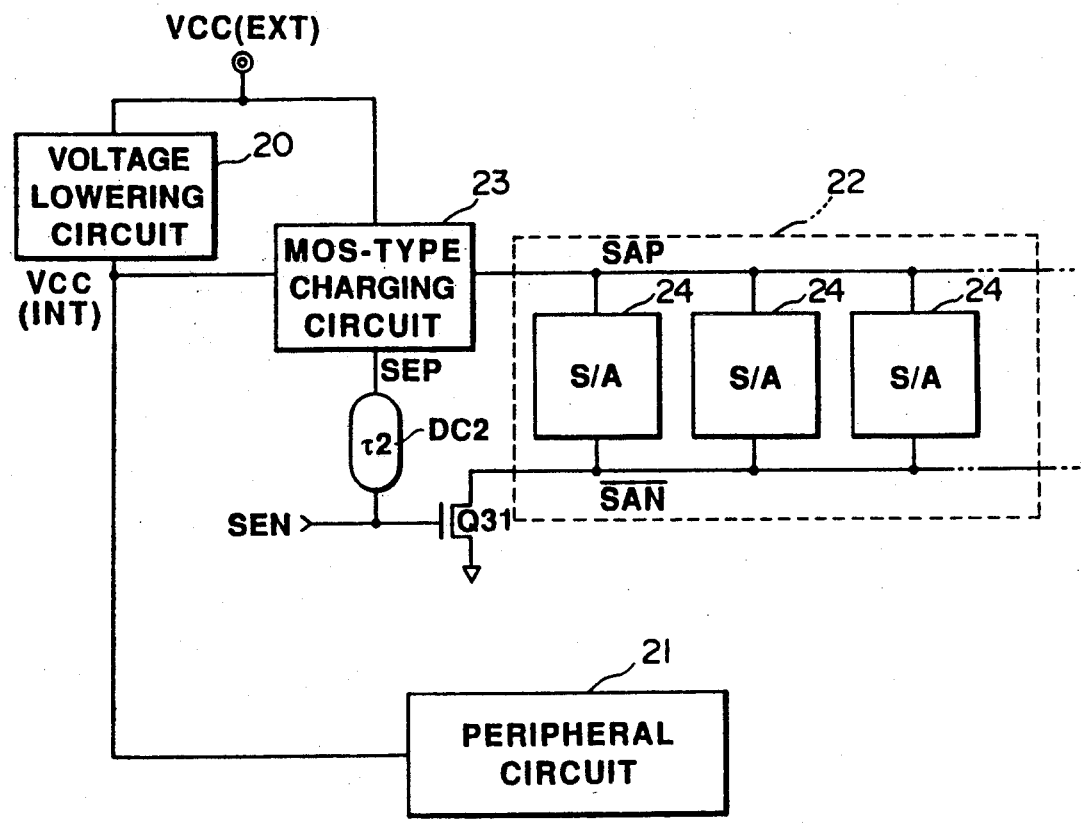
FIG. 1(a) is a block diagram illustrating a configuration of a chip using a MOS-type charging circuit in accordance with an embodiment of the present invention.

A semiconductor memory device to which the present invention is applied has a one-chip structure and comprises, as shown in FIG. 1(a), a supply voltage-lowering circuit 20 for lowering an external supply voltage $V_{cc}$ (EXT) to a desired internal supply voltage $V_{cc}$ (INT), a peripheral circuit 21 driven by the internal supply voltage $V_{cc}$ (INT), and a MOS-type charging circuit 23 for charging sense amplifiers 24 constituting a load circuit 22.

Figure 1B:
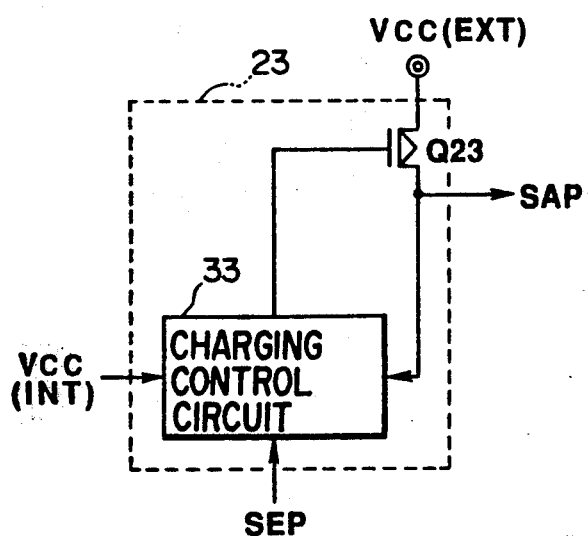
FIG. 1(b) is a diagram illustrating a configuration of the MOS-type charging circuit shown in FIG. 1(a)

As shown in FIG. 1(b), the MOS-type charging circuit 23 comprises a driver transistor Q23 and a charging control circuit 33. The driver transistor Q23 has a source terminal connected to the external power supply ($V_{cc}$ (EXT)) and a drain terminal connected to each sense amplifier 24. The charging control circuit 33 is adapted to compare the voltage of the drain terminal of the driver transistor Q23, i.e., the voltage of an input terminal of each sense amplifier, with the voltage of an output of the supply voltage-lowering circuit 20 serving as a reference potential, i.e., the internal supply voltage $V_{cc}$ (INT). Furthermore, when the voltage of the sense amplifiers' input terminal is lower than the reference potential, the charging control circuit 33 is adapted to transmit a signal for turning on the driver transistor Q23 to the gate terminal of the driver transistor Q23.

Figure 1C:
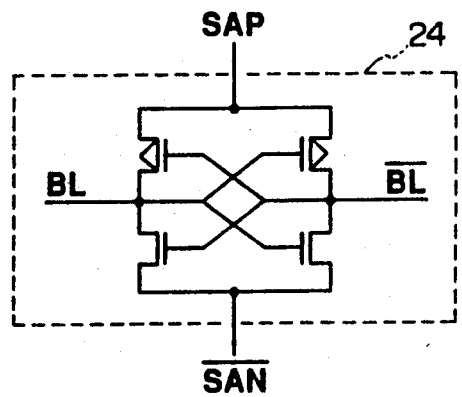
FIG. 1(c) is a circuit diagram illustrating a sense amplifier circuit shown in FIG. 1(a)

In addition, as shown in FIG. 1(c), each of the sense amplifiers 24 is constituted by amplifying transistors connected between bit lines BL and $\overline{BL}$ and adapted to amplify and fetch signals from transistors each constituting a memory cell.

First Embodiment

Figure 1D:
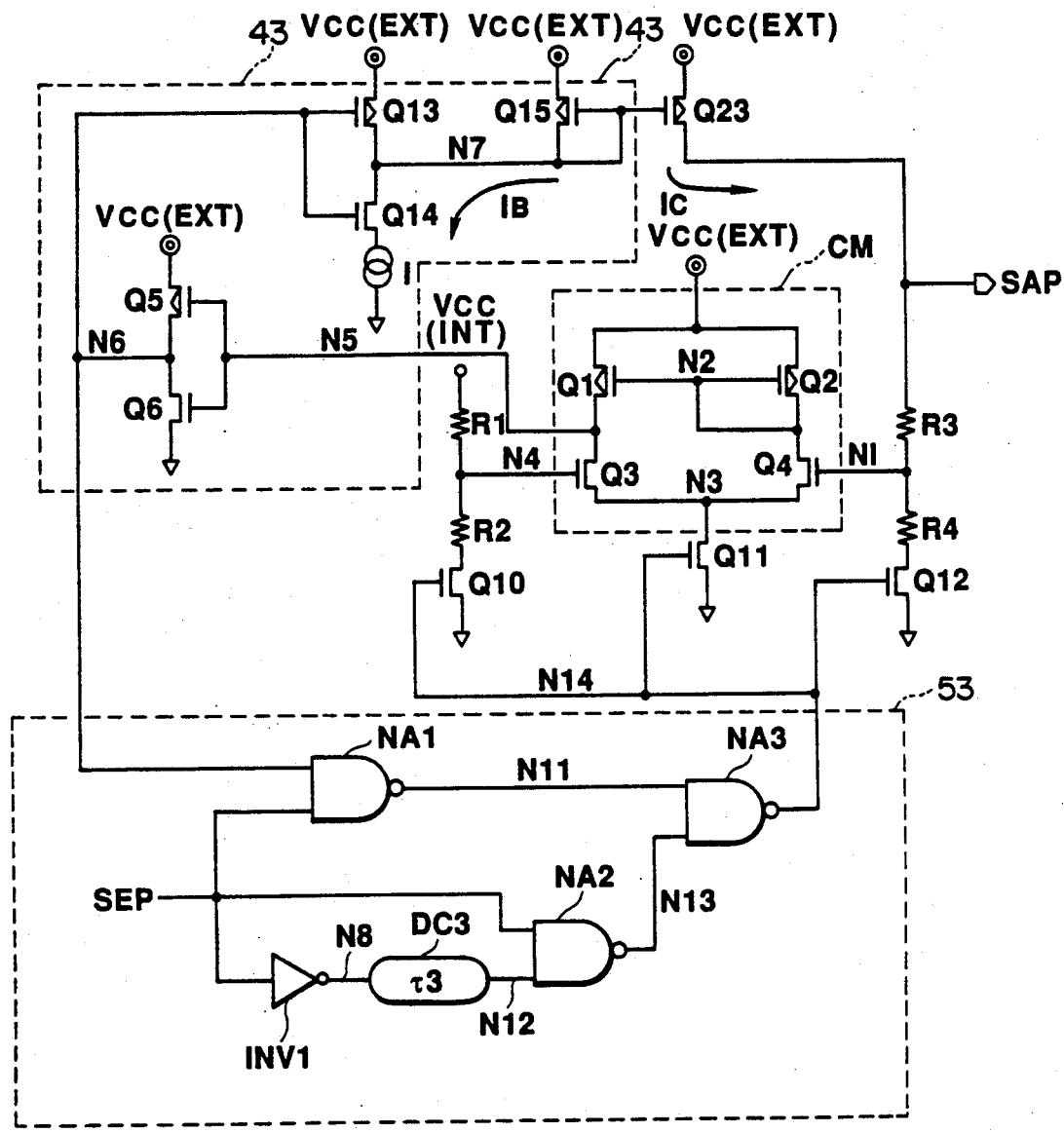
FIG. 1(d) is a diagram illustrating a configuration of a specific MOS-type charging circuit in accordance with a first embodiment of the present invention.

FIG. 1(d) illustrates a specific circuit configuration of the MOS-type charging circuit 23 in accordance with a first embodiment of the present invention.

As shown in FIG. 1(d), this MOS-type charging circuit 23 comprises a charging control circuit 33 including a CMOS current mirror circuit CM constituted by four transistors for comparing the internal supply voltage $V_{cc}$ (INT) with the potential at a terminal SAP connected to the load circuit 22; a p-channel driver transistor Q23 for controlling the charging of the load circuit 22 in response to an output of the CMOS current mirror circuit CM; a constant current circuit 43 interposed between an output terminal N5 of the CMOS current mirror circuit CM and the gate terminal of the driver transistor Q23 and adapted to set the value of a charging current supplied to the load at a substantially fixed level and ensure that the value of the charging current is not dependent on the external supply voltage $V_{cc}$ (EXT); and a deactivating circuit 53 serving as an additional circuit for deactivating the current mirror circuit after the large-capacity load has been charged.

A description will be given hereinunder of the configuration of each circuit and its operation.

Figure 2:
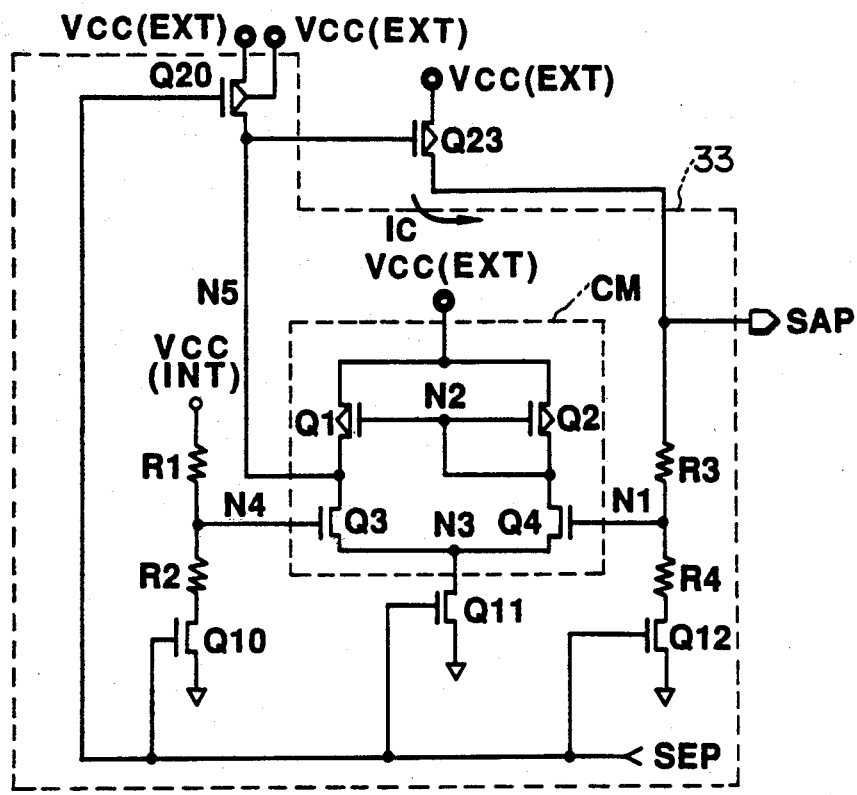
FIGS. 2 and 3 are diagrams illustrating basic circuit configurations in accordance with the first embodiment.

First, as shown in FIG. 2, the MOS-type charging circuit comprises the charging control circuit 33 including the CMOS current mirror circuit CM constituted by four transistors, p-channel transistors Q1, Q2 and n-channel transistors Q3, Q4, and adapted to compare the internal supply voltage $V_{cc}$ (INT) with the potential at the terminal SAP connected to the load circuit 22; and the p-channel driver transistor Q23 for controlling the charging of the load circuit 22 in response to the output of the CMOS current mirror circuit CM.

The source terminals of the p-channel transistors Q1, Q2, Q23 are respectively connected to the external power supply ($V_{cc}$(EXT)), while a common gate terminal N2 of the p-channel transistors Q1, Q2 that make up a pair is connected to both the drain terminal of the p-channel transistor Q2 and the drain terminal of the n-channel transistor Q4.

Meanwhile, the drain terminal N5 of the transistor Q1 is connected to the drain terminal of the n-channel transistor Q3 to provide an output of the CMOS current mirror circuit CM constituted by the transistors Q1, Q2, Q3, Q4, and is also connected to both the gate terminal of the p-channel driver transistor Q23 and the drain terminal of a p-channel transistor Q20.

A common source terminal N3 of the n-channel transistors Q3 and Q4 of the CMOS current mirror circuit CM that make up a pair is grounded via an n-channel transistor Q11.

A gate terminal N4 of the transistor Q3 is a reference potential inputting terminal of the current mirror circuit CM and is connected to resistors R1, R2. Further, the resistor R1 is connected to the internal power supply ($V_{cc}$(INT)), i.e., an output of the supply voltage-lowering circuit 20 (see FIG. 1(b)) for lowering the external supply voltage $V_{cc}$ (EXT), while the resistor R2 is grounded via an n-channel transistor Q10.

A gate terminal N1 of the transistor Q4 serves as an input terminal of the current mirror circuit CM and is connected to resistors R3, R4. Further, the resistor R3 is connected to the terminal SAP which provides an output of the MOS-type charging circuit and is connected to the load circuit 22 (sense amplifiers 24), while the resistor R4 is grounded via an n-channel transistor Q12.

In this case, the values of the resistors R1 and R3 and those of the resistors R2 and R4 are generally set in such a manner as to be equal, respectively. In addition, the values of the resistors R1 and R2 and the resistors R3 and R4 are set to be values that permit a through current to flow across the resistors when the circuit is operative, and the ratio between the resistors R1 and R2 one the one hand, and R3 and R4 on the other, is set to be a value that maximizes the sensitivity of the current mirror circuit CM.

A control signal SEP is input to the gate terminals of the transistors Q10, Q11, Q12 to control the operation of the current mirror circuit CM, and the drain terminal of the driver transistor Q23 is connected to SAP so as to control the charging and discharging of the load circuit 22.

Referring now to the timing charts of FIGS. 8(a) to 8(c), a description will be given of the operation of the MOS-type charging circuit having the above-described configuration. FIGS. 8(a) to 8(c) are diagrams respectively illustrating the potential of each signal, the potential at each terminal of the current mirror circuit CM of the charging control circuit, and the current flowing across the driver transistor 23.

First, in the initial state the control signal SEP is at low level and the transistors Q10, Q11, Q12 are off, so that the current mirror circuit CM does not operate. In addition, since the transistor Q20 is on, the terminal N5 is precharged to the level of $V_{cc}$ (EXT), so that the transistor Q23 is completely off. In the initial state in which SAP is precharged to $\frac{1}{2} V_{cc}$ (INT), no through current flows across the MOS-type charging circuit.

At this juncture, when the control signal SEP shifts from low level to high level, the transistors Q10, Q11, Q12 turn on, so that the potential at the input terminal N1 of the current mirror circuit CM becomes lower than the reference potential of the terminal N4. Consequently, the current mirror circuit CM operates in such a manner as to set the output terminal N5 to low level. In addition, the transistor Q20 turns off simultaneously with this operation.

When the terminal N5 is set to low level, the driver transistor Q23 turns on, and the charging of the load circuit connected to SAP is hence commenced. Then, when the charging of the load circuit progresses and the potential of SAP becomes higher than that of the internal power supply ($V_{cc}$(INT)), the current mirror circuit CM operates in such a manner that the terminal N5 is set to high level, and turns off the driver transistor Q23, thereby stopping the charging of the load.

Subsequently, when a row address strobe signal ($\overline{RAS}$) shifts from low level to high level to commence a precharging state, the control signal SEP shifts from high level to low level, while the transistors Q10, Q11, Q12 turn off and the transistor Q20 on, thereby returning to the initial state.

Since the sense amplifiers 24 are thus charged not by the internal supply voltage but by the external supply voltage, even in cases where a large current instantaneously flows to the sense amplifiers 24, it is possible to stably maintain the operation of the peripheral circuit 21 and the supply voltage-lowering circuit 20.

In addition, as for the conventionally required two units of driver transistors disposed between the external power supply and the sense amplifiers, only one unit can be used, so that it is possible to substantially reduce the chip area.

A description will now be given of a circuit configuration in which the constant current circuit 43 is added to the above circuit configuration.

This circuit configuration is provided to ensure that the value of a charging current to the load becomes substantially fixed and that the value of the charging current is not dependent upon the external supply voltage $V_{cc}$ (EXT).

Figure 3:
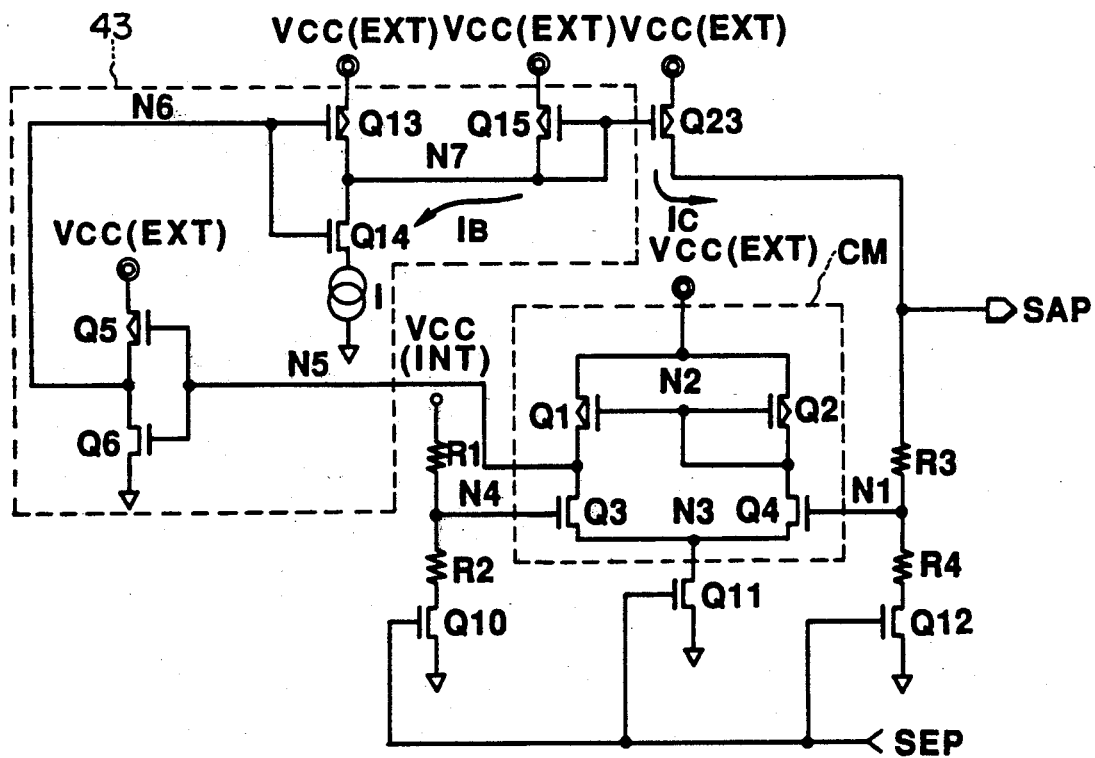

As shown in FIG. 3, although the output terminal N5 of the CMOS current mirror circuit CM in the first embodiment shown in FIG. 2 is directly connected to the gate terminal of the driver transistor Q23, this MOS-type charging circuit is characterized in that the constant current circuit 43 constituted by transistors Q5, Q6, Q13, Q14, Q15 and a constant current circuit I is interposed between the output terminal N5 of the CMOS current mirror circuit CM and the gate terminal of the driver transistor Q23 to ensure that the value of the charging current to the load becomes substantially fixed and that the value of the charging current is not dependent upon the external supply voltage $V_{cc}$ (EXT).

In addition, in FIG. 3, the p-channel transistor Q20 whose gate terminal is connected to SEP in the basic circuit configuration shown in FIG. 2 is deleted.

A description will now be given of the configuration of this newly interposed constant current circuit 43.

In this circuit, the source terminals of the p-channel transistors Q5, Q13, Q15 are connected to the external power supply ($V_{cc}$ (EXT)). An output of the output terminal N5 of the current mirror circuit CM is input to an inverter constituted by the p-channel transistor Q5 and the n-channel transistor Q6. An output terminal N6 of this inverter is connected to the gate terminals of the p-channel transistor Q13 and the n-channel transistor Q14 and is grounded via the constant current circuit I connected to the source terminal of the n-channel transistor Q14.

The constant current circuit I is constituted by, for instance, a MOS transistor with a pentode in terms of its operating region. A common drain terminal N7 of the transistors Q13, Q14 is connected to the commonly connected gate terminal and drain terminal of the p-channel transistor Q15 and the gate terminal of the p-channel driver transistor Q23.

The remaining parts of the circuit configuration are similar to those of the circuit illustrated in the first embodiment, and the identical components are denoted by the same reference numerals.

A description will now be given of the MOS-type charging circuit with the constant current circuit added thereto.

First, in the initial state the control signal SEP is at low level and the transistors Q10, Q11, Q12 are off, so that the current mirror circuit CM does not operate. In addition, the output terminal N5 of the current mirror circuit CM is precharged to high level by the transistor Q1, with the result that the N6 is at low level. Consequently, the transistor Q13 turns on, the transistor Q14 off, and the terminal N7 is precharged to the potential of the external supply voltage $V_{cc}$ (EXT), so that the driver transistor Q23 is off.

Then, when the control signal SEP is set to high level, the transistors Q10, Q11, Q12 turn on, and the potential at the input terminal N1 of the current mirror circuit CM becomes lower than the reference potential of the terminal N4, so that the current mirror circuit CM operates in such a manner as to set the output terminal N5 to low level.

Subsequently, when the terminal N5 of the current mirror circuit CM is set to low level, the terminal N6 is set to high level, causing the transistor Q13 to turn off and the transistor Q14 on, so that a bias current $I_B$ flows across the transistors Q15, Q14 and the constant current circuit I.

In consequence, the potential at the terminal N7 drops, and the driver transistor Q23 turns on. A charging current $I_C$ flowing across the transistor Q23 becomes a constant current represented by the formula:

$$I_C = I_B (WQ23/WQ15) \tag{1}$$

where WQ23 is the channel width of the transistor Q23, and WQ15 is the channel width of the transistor Q15. The reason why Formula (1) holds is because the source potentials and the gate potentials of the transistors Q15 and Q23 are common. Even if the external supply voltage $V_{cc}$ (EXT) fluctuates from an optimum setting, the constant current circuit I absorbs the voltage fluctuations, and the potential difference between the external supply voltage $V_{cc}$ (EXT) and the terminal N7 is kept at a fixed level. As a result, the charging current $I_C$ flowing across the transistor Q23 is not dependent upon $V_{cc}$ (EXT).

As the charging of the load circuit progresses and the potential of SAP becomes higher than that of the internal supply voltage $V_{cc}$ (INT), the output terminal N5 of the current mirror circuit CM shifts to high level and the terminal N6 to low level, and the terminal N7 is precharged to the level of $V_{cc}$ (EXT) by the transistor Q13.

Accordingly, the driver transistor Q23 turns off, thereby stopping the charging of the load circuit.

When the row address strobe signal $\overline{RAS}$ changes from low level to high level to commence a precharging state, the control signal SEP shifts from high level to low level, and the transistors Q10, Q11, Q12 are set to off, thereby returning to the initial state.

In this circuit, even when the external supply voltage $V_{cc}$ (EXT) fluctuates from an optimum design value, the constant current circuit I absorbs the voltage fluctuations, whereby the potential difference between the external power supply ($V_{cc}$(EXT)) and the terminal N7 is kept at a constant level. As a result, the fluctuations of the charging current $I_C$ flowing across the transistor Q23 are prevented.

A sudden rise of the supply current and a high peak of the supply current that are entailed by the charging of a large-capacity load can cause power supply noise inside the chip, and result in a malfunctioning of the memory and a drop in the operating margin. In this circuit configuration, however, the charging current to the load is held down to a low current, and the value of the charging current is not dependent upon the potential of the external supply voltage $V_{cc}$(EXT). In addition, control of a rise in the supply current entailed by the charging of a large-capacity load and its peak value is facilitated.

A description will now be given of a circuit configuration wherein a deactivating circuit 53 is added to the configuration shown in FIG. 3 as an additional circuit for deactivating the current mirror circuit CM after charging the large-capacity load.

In the deactivating circuit 53 of the MOS-type charging circuit, as shown in FIG. 1(d), an inverter INV1 is connected to the control signal SEP, and a delay circuit DC3 is connected to an output terminal N8 of the inverter INV1. The control signal SEP and an output terminal N12 of the delay circuit DC3 connected to the terminal N8, which is an inverted output of the control signal SEP, are connected to input terminals of a NAND gate NA2, while the terminal N6 and SEP serve as input terminals of a NAND gate NA1. Output terminals N11, N13 of the NAND gates NA1 and NA2 provide inputs for a NAND gate NA3, and its output terminal N14 is connected to the gate terminals of the transistors Q10, Q11, Q12.

The remaining parts of the circuit configuration are similar to those of the basic circuit configuration shown in FIG. 2.

The operation of the above-described circuit will be described hereinunder.

In the initial state, since SEP is at low level, the terminals N11, N13 are set at high level, with the result that the terminal N14 is set to low level, so that the transistors Q10, Q11, Q12 are off and the CMOS current mirror circuit CM remains inoperative.

The output terminal N5 of the current mirror circuit CM is precharged to high level by the transistor Q1, with the result that the terminal N6 is set to low level, and the transistor Q13 turns on and the transistor Q14 off. In addition, since the terminal N7 is precharged to the level of the external supply voltage $V_{cc}$(EXT), the driver transistor Q23 is off.

When the control signal SEP is set to high level, the output terminal N13 of the NAND gate NA2 is set to low level. Consequently, the output terminal N14 of the NAND gate NA3 is set to high level, causing the transistors Q10, Q11, Q12 to turn on.

The operation of charging the SAP after the turning on of the transistors Q10, Q11, Q12 is effected in a similar manner to the case of the basic configuration shown in FIG. 3.

With a lapse of a time $\tau3$ after SAP is set to high level, the output terminal N13 of the NAND gate NA2 shifts again from low level to high level, while the N11, which is the other input terminal of the NAND gate NA3, shifts from high level to low level when the CMOS current mirror circuit starts its operation.

Accordingly, if the delay circuit is set in such a manner that the terminal N13 shifts from low level to high level after the terminal N11 has shifted to low level, the terminal N14 remains at high level while the charging of SAP is being effected. If the potential of SAP becomes higher than that of the internal supply voltage $V_{cc}$(INT), the charging of the load circuit is stopped in a similar manner to the case of the basic configuration shown in FIG. 3.

At this time, since the terminal N6 is set to low level, the terminal N11 is set to high level and the terminal N14 to low level, so that the current mirror circuit becomes inoperative.

Accordingly, after completion of the charging of the load circuit, no through current flows across the transistors Q10, Q11, Q12, so that the current mirror circuit becomes inoperative.

When the row address strobe signal shifts from low level to high level to commence a precharging state, the control signal SEP shifts from high level to low level, thereby returning to the initial state.

Thus, in the circuit configuration of the first embodiment of the present invention, after completion of the charging of the load circuit, no through current flows across the transistors Q10, Q11, Q12, and the current mirror circuit becomes inoperative, so that the MOS-type charging circuit does not undergo an oscillating operation.

That is, in the MOS-type charging circuit shown in FIG. 2, a feedback-type circuit is employed which operates in such a manner that when a through current flows across the load circuit and the potential of SAP which has reached the internal supply voltage $V_{cc}$(INT) again drops below $V_{cc}$(INT), the driver transistor Q23 turns on to maintain the potential of SAP at a fixed level. Hence, there has been a problem in that the charging circuit is liable to oscillate. In this example, however, the arrangement provided is such that, after completion of the charging, the current mirror circuit is made inoperative, so that the oscillation is prevented.

In addition, in this circuit configuration, after completion of the charging of the load circuit, no through current flows across the transistors Q10, Q11, Q12 and the current mirror circuit becomes inoperative, so that it is possible to effect a reduction in power consumption.

Incidentally, in the basic circuit configuration shown in FIG. 3, even when no through current is present in the load circuit and the potential of SAP is kept at a fixed level, a through current flows across the transistors Q10, Q11, Q12 until SEP shifts to low level, which has been a factor increasing the power consumption of the chip.

Although in the foregoing embodiment the ratio between the resistors R1 and R2 and the ratio between the resistors R3 and R4 are set to be equal, the ratio between the resistors R1 and R2 and the ratio between the resistors R3 and R4 may be altered slightly.

That is, in cases where the deactivating circuit is added to the MOS-type charging circuit as in the case of the first embodiment, if R2/R1 is set to be slightly smaller than R4/R3, the characteristics improve further in the following two aspects.

In a commonly employed supply voltage-lowering circuit, the operation is effected such that when the external supply voltage $V_{cc}$(EXT) is decreased continuously, at a certain voltage (e.g., 3.5 V) or below the value of the internal supply voltage $V_{cc}$(INT) becomes substantially equal to the external supply voltage $V_{cc}$ (EXT).

In this situation, if the ratio between the resistors R1 and R2 and the ratio between the resistors R3 and R4 are made equal, the potential at the terminal N1 does not become higher than that at the terminal N4, so that it is conceivable that the deactivating circuit may become inoperative.

However, for instance, by assuming that R1=R3=15 kΩ, and R2=9.5 kΩ, and R4=10 kΩ and by thus providing a setting such that R2/R1 becomes slightly smaller than R4/R3, even in cases where the value of the internal supply voltage $V_{cc}$ (INT) is equal to the external supply voltage $V_{cc}$ (EXT), the potential at the terminal N1 can be made higher than the potential at the terminal N4. Thus the deactivating circuit can be made to operate favorably.

In addition, the provision of the setting such that R2/R1 becomes slightly smaller than R4/R3 is also advantageous in cases where the external supply voltage $V_{cc}$ (EXT) is higher than the internal supply voltage $V_{cc}$ (INT) (e.g., the external supply voltage $V_{cc}$ (EXT)=5 V, the internal supply voltage $V_{cc}$ (INT)=4 V).

That is, if R2/R1=R4/R3, a time lag occurs when the potential at the terminal N1 becomes higher than that at the terminal N4 upon completion of the charging of a large-capacity load, and after it is then determined by the control circuit that the load circuit is to be deactivated and until the driver MOS transistor Q23 actually turns off. At the point of time when the driver MOS transistor Q23 actually turns off, the potential at the terminal SAP would become substantially higher than the internal supply voltage $V_{cc}$ (INT). In contrast, by providing the setting such that R2/R1 becomes slightly smaller than R4/R3 (R2/R1−α=R4/R3), the potential at the terminal SAP can be made substantially equal with that of the internal supply voltage $V_{cc}$ (INT) when the driver MOS transistor Q23 turns off.

The magnitude of the difference α between R2/R1 and R4/R3 is determined on the basis of the time lag elapsing after it is judged by the control circuit that the load circuit is to be deactivated and until the driver MOS transistor actually turns off, and also on the basis of an upward inclination of the potential resulting from the sustained charging during the time lag.

In other words, if the potential rising due to the sustained charging during the time lag until the driver MOS transistor actually turns off is assumed to be a Δ internal supply voltage $V_{cc}$ (INT), and if the reference voltage $V_{ref}$ which is used when the case is determined to be that of deactivation as a result of a comparison with the terminal SAP, is assumed to be the internal supply voltage $V_{cc}$ (INT) − the Δ internal supply voltage $V_{cc}$ (INT), the potential at the terminal SAP becomes substantially equal to the internal supply voltage $V_{cc}$ (INT) when the driver MOS transistor Q23 turns off.

Accordingly, it suffices if the values of R1 to R4 are determined in such a manner that the following formula is satisfied:

$$\frac{\text{internal supply voltage } V_{CC}(INT) - \Delta \text{ internal supply voltage } V_{CC}(INT)}{\text{internal supply voltage } V_{CC}(INT)} = \frac{(R3 + R4) \cdot R2}{(R1 + R2) \cdot R4} \quad (2)$$

Although a resistive dividing circuit is used here, the resistive dividing circuit is not necessarily required, and it suffices to employ a means which is capable of setting the reference voltage $V_{ref}$ at the time of making a determination on the deactivation.

Second Embodiment

Figure 4:
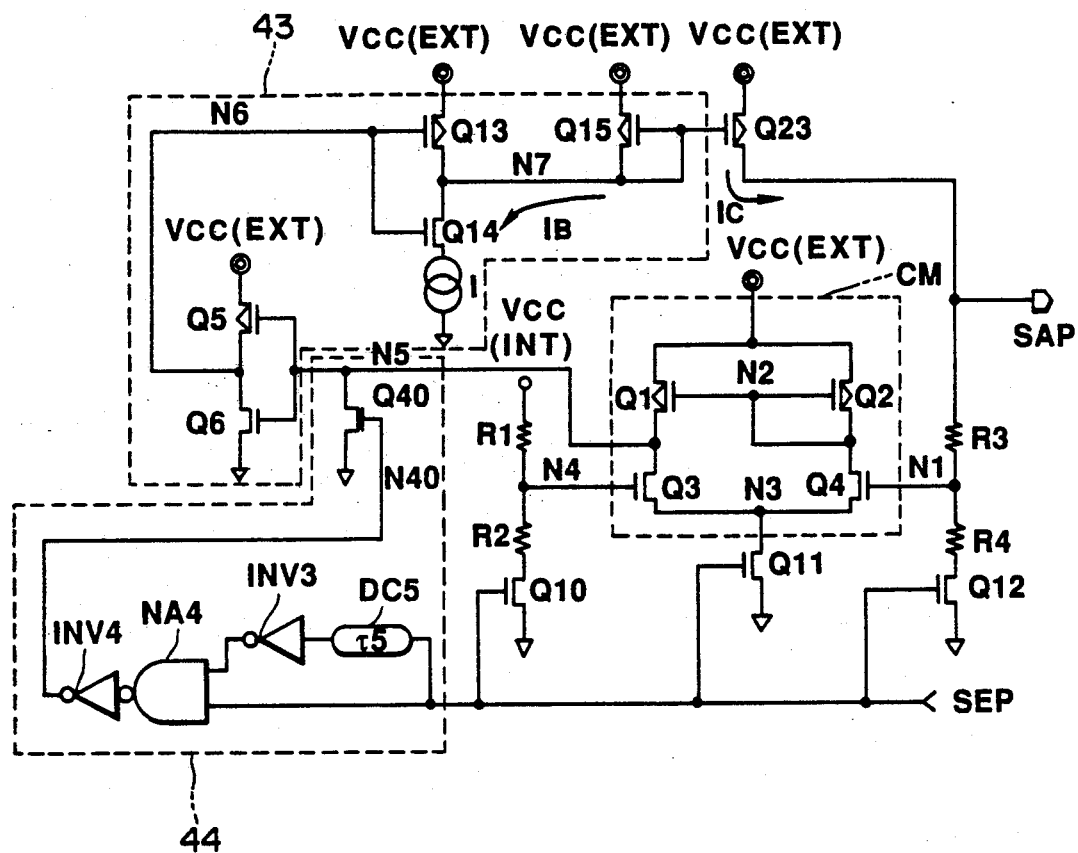
FIG. 4 is a diagram illustrating a specific circuit configuration in accordance with a second embodiment.

Referring now to FIG. 4, a description will be given of a second embodiment of the present invention which incorporates in the MOS-type charging circuit a low-level maintaining circuit for forcedly maintaining the output of the CMOS current mirror circuit at low level for a fixed time through an input of a control signal thereto.

In the circuit configuration shown in FIG. 3, after the control signal SEP is set to high level, the CMOS current mirror circuit becomes operative, and the output terminal N5 of the CMOS current mirror circuit is set to low level. However, since the response speed of the current mirror circuit is not very fast, the voltage at the terminal N5 shifts slowly from high level to low level, so that the voltage at the terminal N5 exhibits slowly descending waveform.

For this reason, the timing at which the output terminal N6 of the transistors Q5, Q6 of the CMOS inverter having the terminal N5 as a gate input shifts from low level to high level after SEP is set to high level is liable to be affected by variations in the characteristics of the transistors Q5, Q6.

Furthermore, since the response speed of the current mirror circuit changes substantially depending on the external supply voltage $V_{cc}$ (EXT), the timing at which the terminal N6 shifts from low level to high level varies substantially depending on the value of the external supply voltage $V_{cc}$ (EXT) as well.

A change in the operating timing of the transistors Q5, Q6 of the CMOS inverter directly leads to a change in the timing for starting the charging of SAP, possibly resulting in a malfunctioning of the bit-line sense amplifiers.

This embodiment shows an easy-to-control MOS-type charging circuit in which the starting timing of charging the SAP is difficult to change regardless of fluctuations in the external supply voltage $V_{cc}$ (EXT) and variations in the characteristics of the transistors.

As shown in FIG. 4, a low-level maintaining circuit 44 of this MOS-type charging circuit is arranged such that a delay circuit DC5 and a NAND gate NA4 are connected to the control signal SEP, an output of the delay circuit DC5 is input to an inverter INV3, and an output of the inverter INV3 serves as an input to the NAND gate NA4.

In addition, an output of the NAND gate NA4 is input to an inverter INV4, and an output of the inverter INV4 is connected to a gate terminal N40 of an n-channel transistor Q40 having a drain terminal N5.

The remaining parts of the circuit configuration are similar to those of the basic circuit configuration shown in FIG. 3.

The operation of this circuit will be described hereinunder.

In the initial state, since SEP is at low level, the transistors Q10, Q11, Q12 are off, and the CMOS current mirror circuit is inoperative.

At this time, the gate terminal N40 of the transistor Q40 is at low level, so that the transistor Q40 is off.

Meanwhile, the output terminal N5 of the CMOS current mirror circuit is precharged to high level by the transistor Q1. As a result, the terminal N6 is set to low level, the transistor Q13 turns on and the transistor Q14 off, and the terminal N7 is precharged to the level of the external supply voltage $V_{cc}$ (EXT), so that the driver transistor Q23 is off.

When the control signal SEP is set to high level, the transistor Q40 is set in the "on" state during a delay time τ5 set by the delay circuit DC5, and the terminal N5 is set to low level.

Concurrently with this operation, the transistors Q10, Q11, Q12 turn on, and the CMOS current mirror circuit operates in such a manner as to set the terminal N5 to low level. Thus, the terminal N5 is set to low level through both the discharging via the transistor Q40 and the operation of the CMOS current mirror circuit. However, since the response speed of the current mirror circuit is slow, it is when the transistor Q40 turns on that the terminal N5 actually shifts to low level, so that the response speed with which the terminal N5 shifts to low level also becomes fast.

The delay time τ5 set by the delay circuit DC5 is set in such a manner as to time up sufficiently before the completion time of the charging of the SAP.

Both the operation of charging the SAP after the terminal N5 is set to low level and the precharging operation after the row address strobe signal $\overline{RAS}$ shifts from low level to high level are effected in a similar manner to the basic circuit shown in FIG. 3.

Thus, in this configuration, since the output terminal N5 of the current mirror circuit is forcedly maintained at low level for a fixed time by the transistor Q40 after the control signal SEP is input, the response speed with which the terminal N5 shifts from high level to low level is made fast. In addition, even if the value of the external supply voltage $V_{cc}$ (EXT) varies, the response speed of the output terminal N5 of the current mirror circuit does not vary so much.

Accordingly, the timing from the time when the control signal SEP is input and until the charging of the SAP is commenced does not change substantially regardless of variations in the characteristics of the transistors Q5, Q6 and the value of the external supply voltage $V_{cc}$(EXT), so that controllability improves substantially.

Third Embodiment

Figure 5:
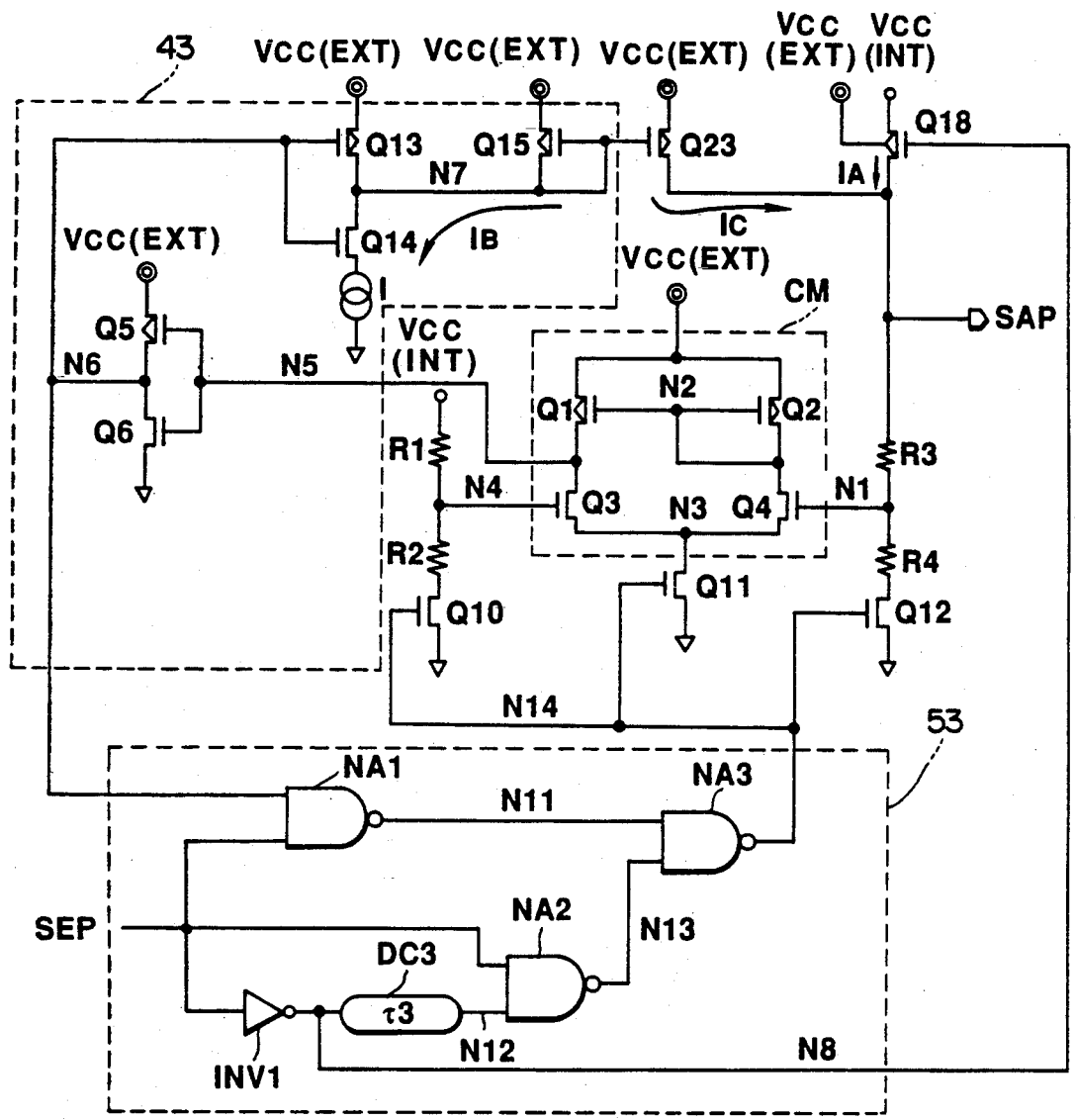
FIG. 5 is a diagram illustrating a specific circuit configuration in accordance with a third embodiment.

Referring now to FIG. 5, a description will be given of a third embodiment of the present invention.

In this MOS-type charging circuit, in addition to the circuit configuration of the first embodiment, a p-channel transistor Q18 having a terminal N8 as a gate input and using the external supply voltage $V_{cc}$ (EXT) as the well potential is interposed between the internal power supply ($V_{cc}$ (INT)) and the terminal SAP connected to the load circuit. This configuration is so designed that the potential of the load can be held at the level of the internal supply voltage $V_{cc}$ (INT) while the control signal SEP is at high level even after the CMOS current mirror has stopped its operation.

The other parts of the circuit configuration are similar to those of the circuit shown in the first embodiment.

A description will now be given of the operation of this circuit.

The p-channel transistor Q18 turns on when the control signal SEP shifts from low level to high level, while the charging of the load circuit is effected by a current $I_A$ flowing across the transistor Q18 and the current $I_C$ flowing across the p-channel driver transistor Q23. In this case, the channel width of the transistor Q18 is set in such a manner that the current $I_A$ flowing across the transistor Q18 becomes approximately one-tenth of the current flowing across the transistor Q23 in order to minimize fluctuations of the internal supply voltage $V_{cc}$ (INT) resulting from the charging of the load circuit and maintain the constancy of the charging current to the load circuit.

As the charging of the load circuit progresses and the potential of SAP becomes higher than the internal supply voltage $V_{cc}$ (INT), the p-channel driver transistor Q23 turns off in the same way as the first embodiment, but the transistor Q18 remains on insofar as the control signal is at high level.

Accordingly, even if the control signal SEP remains at high level for a long time, the potential of the load charged does not drop below the level of the internal supply voltage $V_{cc}$ (INT).

Thus, this MOS-type charging circuit is capable of preventing the problem experienced in the first embodiment. That is, in the first embodiment, the MOS-type charging circuit stops charging when the potential of the load reaches the level of the internal supply voltage $V_{cc}$ (INT), the charging operation is not resumed even if the potential of the load drops below the level of the internal supply voltage $V_{cc}$ (INT) due to a leak current, and the longer the period during which the control signal SEP is at high level, the greater the drop in the potential of the load due to the leak current, thereby causing a malfunctioning of the chip.

In this embodiment, since it takes time after the current mirror circuit starts its operation and until the terminal N5 reaches the low level, if the channel widths of the transistors Q1, Q2, Q3, Q4 constituting the current mirror circuit and the switching transistor Q11 for the current mirror circuit are enlarged, it is possible to shorten the response time until the terminal N5 reaches the low level. However, since this measure leads to an increase in the pattern area and power consumption, the question is whether to shorten the response time or reduce the chip size.

It should be noted that, in this embodiment as well, the ratio between the resistors R1 and R2 and the ratio between the resistors R3 and R4 may be slightly altered in the same way as the modification of the first embodiment.

In other words, as described in the first embodiment, in cases where the deactivating circuit is added to the MOS-type charging circuit, if R2/R1 is made slightly smaller than R4/R3, it is possible to make the potential at the terminal N1 higher than the potential at the terminal N4 even when the value of the internal supply voltage $V_{cc}$ (INT) is equal to the external supply voltage $V_{cc}$ (EXT). Hence, the deactivating circuit can be made to operate favorably, and the potential at the terminal SAP can be made substantially equal to the internal supply voltage $V_{cc}$ (INT) when the driver MOS transistor Q23 actually turns off.

Fourth Embodiment

Hereinunder, a description will be given of a fourth embodiment of the present invention.

Figure 6:
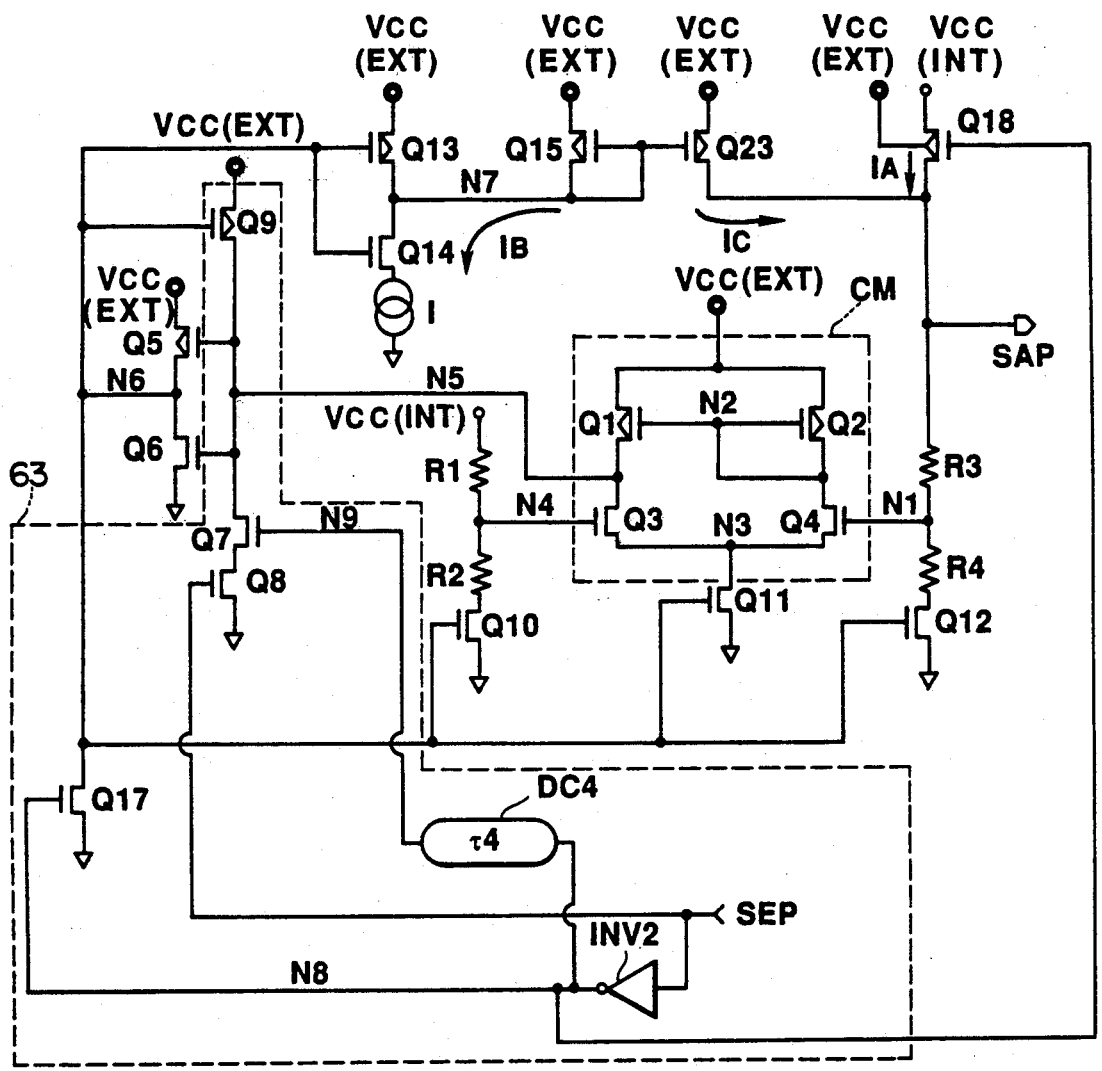
FIG. 6 is a diagram illustrating a specific circuit configuration in accordance with a fourth embodiment.

As shown in FIG. 6, an additional circuit 63 is added in this circuit configuration. The additional circuit 63 comprises, in place of the deactivating circuit 53 shown in the third embodiment, a deactivating circuit which is adapted to automatically deactivate the current mirror circuit after the charging of the load circuit and which includes a transistor Q8 connected to the control signal SEP, a CMOS inverter INV2, a transistor Q17, a transistor Q18, and a delay circuit DC4, the latter three being connected to an output terminal N8 of the inverter INV2. The deactivating circuit 63 also includes a circuit in which transistors Q7, Q8, Q9 are connected to the output terminal N5 of the current mirror circuit. This circuit configuration is so designed to shorten the time elapsing from the rise of SEP and until the driver transistor Q23 turns on and to make it possible to automatically deactivate the current mirror circuit with a few number of elements after the charging of the load circuit.

The remaining parts of the MOS-type charging circuit are similar to those of the embodiment 1.

In other words, the source terminals of the p-channel transistors Q1, Q2, Q5, Q9, Q13, Q15, Q23 are respectively connected to the external power supply ($V_{cc}$ (EXT)).

The common gate terminal N2 of the p-channel transistors Q1 and Q2, which constitute the CMOS current mirror circuit and make up a pair, is connected to both the drain terminal of the p-channel transistor Q2 and the drain terminal of the n-channel transistor Q4.

The drain terminal N5 of the transistor Q1 is connected to the drain terminal of the n-channel transistor Q3 to provide an output of the CMOS current mirror circuit CM constituted by the transistors Q1, Q2, Q3, Q4. Also, the terminal N5 is connected to both the drain terminal of the transistor Q9 and the gate terminal of the transistors Q5, Q6 constituting the CMOS inverter, and is grounded via the n-channel transistors Q7, Q8.

The common source terminal N3 of the n-channel transistors Q3 and Q4 of the current mirror circuit CM that make up a pair is grounded via the transistor Q11. The gate terminal N4 of the transistor Q3 is a reference potential-inputting terminal of the current mirror circuit CM and is connected to the resistors R1, R2. Further, the resistor R1 is connected to the internal power supply ($V_{cc}$ (INT)), while the resistor R2 is grounded via the n-channel transistor Q10.

The gate terminal N1 of the transistor Q4 serves as an input terminal of the current mirror circuit CM and is connected to resistors R3, R4. Further, the resistor R3 is connected to the terminal SAP which is, in turn, connected to the load circuit (sense amplifiers), while the resistor R4 is grounded via the n-channel transistor Q12.

The common output terminal N6 of the transistors Q5, Q6 constituting the CMOS inverter is connected to the gate terminals of the p-channel transistors Q9, Q13 and the n-channel transistors Q10, Q11, Q12, Q14 and is grounded via the n-channel transistor Q17.

The common drain terminal N7 of the transistors Q13, Q14 is connected to the commonly connected gate terminal and drain terminal of the p-channel transistor Q15 as well as the gate terminal of the p-channel driver transistor Q23.

The source terminal of the transistor Q14 is grounded via the constant current circuit I.

The control signal SEP of this MOS-type charging circuit is input to both the gate terminal of the transistor Q8 and the CMOS inverter INV2, while an output of the output terminal N8 of the inverter INV2 is delivered to the transistor Q17, the gate terminal of the transistor Q18 with one terminal connected to the internal power supply ($V_{cc}$ (INT)) and the other terminal to SAP, and the delay circuit DC4.

An output of the delay circuit DC4 is connected to the gate terminal N9 of the transistor Q7.

It should be noted that the gate length of the transistor Q9 is set to be greater than those of the other transistors, so that the on-state resistance is large.

Figure 9A:
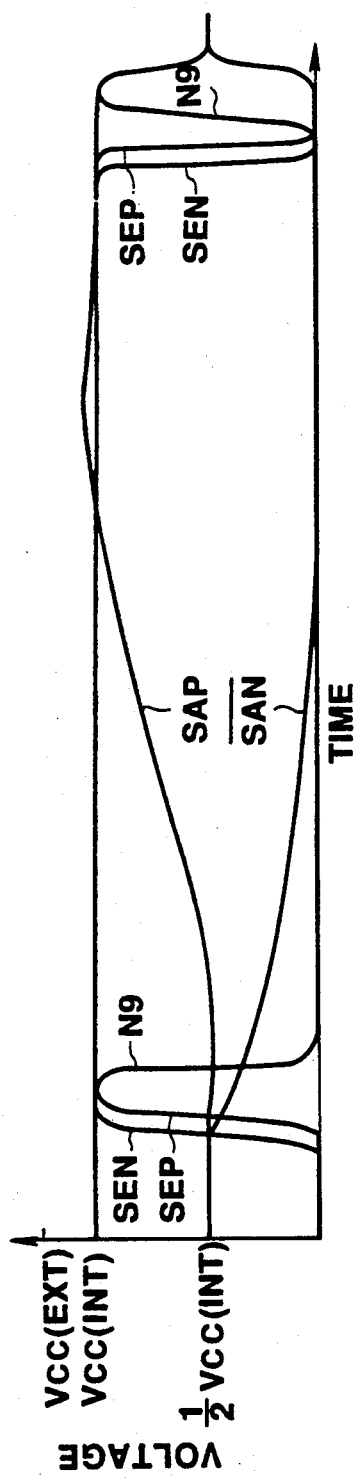
FIGS. 9(a) to 9(c) are timing charts of the MOS-type charging circuit in accordance with the fourth embodiment shown in FIG. 6.
Figure 9B:
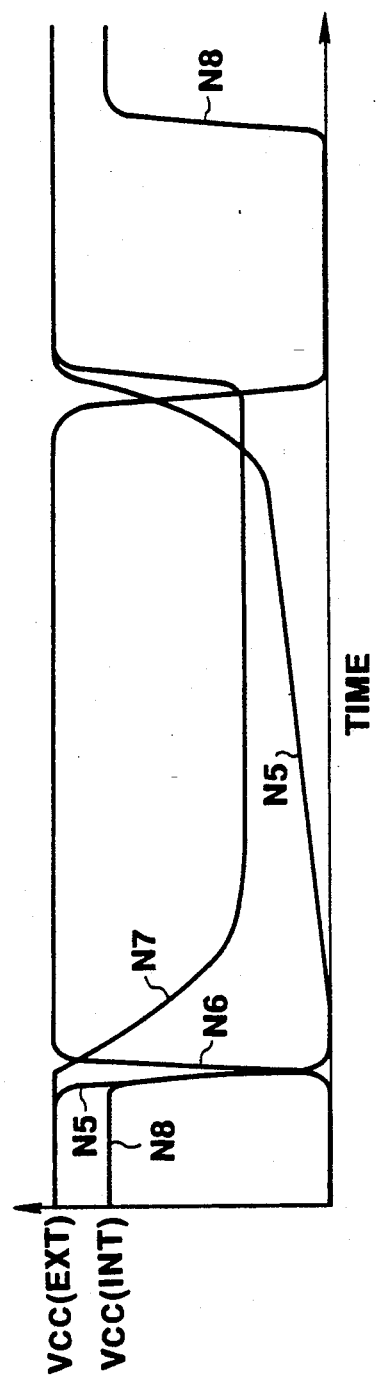
Figure 9C:
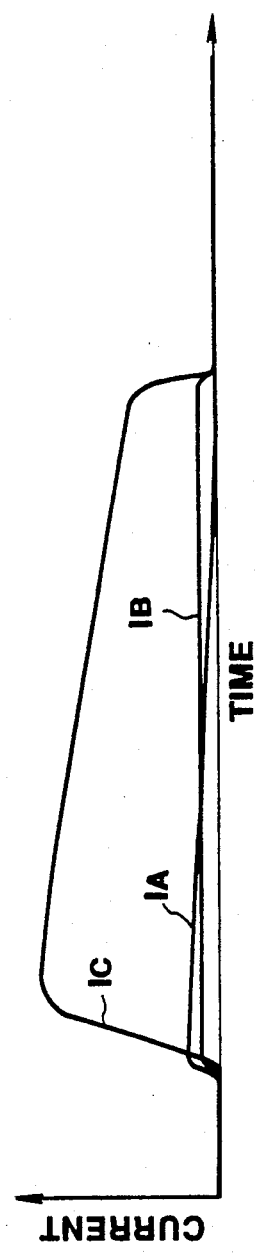

A description will now be given of the operation of the MOS-type charging circuit having the above-described arrangement. FIGS. 9(a) to 9(c) are timing charts respectively illustrating fluctuations in the potential of the SEN, SEP, and SAP signals, the potential at each terminal, and the currents flow through the transistors Q15, Q18 and Q23.

First, in the initial stage, the control signal SEP is at low level, and the transistor Q17 is on. Accordingly, the terminal N6 is at low level, and the transistors Q10, Q11, Q12 are off, so that the current mirror circuit is inoperative.

In addition, since the transistor Q13 is on and the transistor Q14 is off, the terminal N7 is precharged to the level of the external supply voltage $V_{cc}$ (EXT), with the result that the p-channel driver transistor Q23 is off.

Since the terminal N8 is at high level, the p-channel transistor Q18 also turns off, so that the external power supply ($V_{cc}$ (EXT)) and the terminal SAP connected to the load circuit are completely cut off from each other.

In the initial state, SAP is at the precharging level, i.e., $\frac{1}{2} V_{cc}$ (INT), of bit lines BL, $\overline{BL}$. The output terminal N5 of the current mirror circuit is precharged to the level of the external supply voltage $V_{cc}$ (EXT) since the transistor Q8 is off and the transistor Q9 is on. In the initial state, no through current flows across the MOS-type charging circuit.

Subsequently, when the control signal SEP shifts from low level to high level, the terminal N8 shifts to low level by means of the inverter INV2, which, in turn, causes the transistor Q17 to turn off and the transistor Q18 on.

In addition, since the transistor Q8 turns on, and the transistor Q7 remains in the on state during the time τ4 after the SEP is set to high level, the output terminal N5 of the current mirror circuit is forcedly set at low level.

As a result, the terminal N6 is set to high level, the transistor Q13 turns off and the transistor Q14 on, with the result the bias current $I_B$ flows across the transistors Q15, Q14, and the constant current circuit I, and the potential at the terminal N7 drops, thereby allowing the driver transistor Q23 to turn on.

Concurrently with the above-described operation, the current mirror circuit is activated. Because the terminal N6 shifts from low level to high level, the transistors Q10, Q11, Q12 turn on, and the current mirror circuit starts its operation. Immediately after the operation start, the potential of SAP is lower than the internal supply voltage $V_{cc}$ (INT), so that the terminal N5 is maintained at low level even after the transistor Q7 turns off with the lapse of the time &4 after the control signal SEP is set to high level.

Thus, as the charging progresses until the potential of the terminal SAP connected to the load circuit becomes higher than the internal supply voltage $V_{cc}$ (INT), the current mirror circuit detects the same, and the terminal N5 shifts from low level to high level. As a result, the terminal N6 shifts to low level, the transistor Q13 turns on and the transistor Q14 off, so that the terminal N7 is precharged again to the level of $V_{cc}$ (EXT), and the driver transistor Q23 turns off.

In addition, concurrently with the above-described operation, the n-channel transistors Q10, Q11, Q12 turn off, so that the current mirror circuit is automatically deactivated.

Even after the current mirror circuit is deactivated, the p-channel transistor Q18 remains in the on state, and the potential of SAP is held at the level of the internal power supply ($V_{cc}$ (INT)).

Then, when the row address strobe signal $\overline{RAS}$ shifts to high level and the memory is set in the precharged state, the control signal SEP shifts from high level to low level, and the transistors Q8, Q18 turn off and the transistors Q7, Q17 on, thereby returning to the initial state.

In this configuration, the time elapsing after the control signal SEP shifts from low level to high level and until the driver transistor Q23 turns on can be shortened substantially as compared with the first and third embodiments.

Namely, in the circuit configuration of the first embodiment, it takes time after the current mirror circuit starts its operation and until the terminal N5 reaches the low level. Therefore, in the circuit of this fourth embodiment, an attempt is made to forcedly maintain the output of the CMOS current mirror circuit at low level to ensure that the response time until the terminal N5 reaches the low level is shortened.

In addition, in the third embodiment, three NAND gates, one inverter, and one delay circuit are used to deactivate the current mirror circuit after the charging is completed and the potential of the load circuit reaches the level of the internal supply voltage $V_{cc}$ (INT) and until the control signal SEP shifts to low level. In contrast, in the circuit of the fourth embodiment, the NAND gates can be dispensed with, and it is possible to realize the same logic with a fewer number of elements, thereby making it possible to reduce the pattern area.

It should be noted that, in this embodiment as well, the ratio between the resistors R1 and R2 and the ratio between the resistors R3 and R4 may be slightly altered in the same way as the modification of the first embodiment and the modification of the third embodiment.

In other words, as described in the first embodiment, in cases where the deactivating circuit is added to the MOS-type charging circuit, if R2/R1 is made slightly smaller than R4/R3, it is possible to make the potential at the terminal N1 higher than the potential at the terminal N4 even when the value of the internal supply voltage $V_{cc}$ (INT) is equal to the external supply voltage $V_{cc}$ (EXT). Hence, the deactivating circuit can be made to operate favorably, and the potential at the terminal SAP can be made substantially equal to the internal supply voltage $V_{cc}$ (INT) when the driver MOS transistor Q23 actually turns off.

Although, in the first to fourth embodiments, a description has been given of the current mirror circuit in which the load transistors are p-channel transistors, the present invention is also applicable to a current mirror circuit in which the load transistors are n-channel transistors.

In addition, although in the third and fourth embodiments the p-channel transistor Q18 is on while SEP is at high level, an arrangement may be alternatively provided such that the p-channel transistor Q18 turns on after SAP reaches the level of the internal supply voltage $V_{cc}$ (INT).

Furthermore, the present invention is not restricted to the foregoing embodiments, and various modifications are possible without departing from the spirit and scope of the invention which is defined solely in the appended claims.

What is claimed is:

1. A MOS-type charging circuit including:
   a MOS transistor having a source terminal, a drain terminal and a gate terminal, one of the source and drain terminals connected to a power supply for supplying a first potential and another one of the source and drain terminals connected to a load circuit,
   a control circuit connected to said another terminal and the gate terminal of the MOS transistor and activated by an input of a control signal thereto for comparing a potential at said another terminal of said MOS transistor with a second potential which is lower than the first potential of said power supply, and said control circuit for allowing said MOS transistor to be conductive so as to effect a charging of the load circuit when the potential at said another terminal is lower than said second potential, and
   a deactivating circuit for deactivating said control circuit when the potential at said another terminal of said MOS transistor becomes higher than said second potential even when the control signal is being input to said control circuit so as to allow to hold said MOS transistor to be non-conductive.

2. A MOS-type charging circuit according to claim 1, wherein said power supply is an external power supply, and said second potential is substantially equal to the potential of an internal power supply.

3. A MOS-type charging circuit including:
   a MOS transistor having a source terminal, a drain terminal and a gate terminal, one of the source and drain terminals connected to a power supply for supplying a first potential and another one of the source and drain terminals connected to a load circuit,
   a control circuit connected to said another terminal and the gate terminal of the MOS transistor and activated by an input of a control signal thereto for comparing a potential at said another terminal of said MOS transistor with a second potential which is lower than the first potential of said power supply, and said control circuit for allowing said MOS transistor to be conductive so as to effect a charging of the load circuit when the potential at said another terminal is lower than said second potential, and
   a deactivating circuit for deactivating said control circuit when the potential at said another terminal of said MOS transistor becomes equal to or higher than said second potential even when the control signal is being input to said control circuit so as to allow to hold said MOS transistor to be non-conductive,
   wherein said control circuit is constituted by a CMOS current mirror circuit.

4. A MOS-type charging circuit according to claim 1 further including a constant current circuit for rendering a current flowing across said load circuit into a constant current when said MOS transistor turns on.

5. A MOS-type charging circuit according to claim 1, wherein said control circuit includes a conducting circuit for selectively conducting a terminal having said second potential and said another terminal of said MOS transistor.

6. A MOS-type charging circuit according to claim 1, wherein said power supply is an external power supply, and said second potential is set to be slightly lower than the potential of an internal power supply.

7. A MOS-type charging circuit including:
   a MOS transistor having a source terminal, a drain terminal and a gate terminal, one of the source and drain terminals connected to a power supply for supplying a first potential and another one of the source and drain terminals connected to a load circuit,
   a control circuit connected to said another terminal and the gate terminal of the MOS transistor and activated by an input of a control signal thereto for comparing a potential at said another terminal of said MOS transistor with a second potential which is lower than the first potential of said power supply, and said control circuit for allowing said MOS transistor to be conductive so as to effect a charging of the load circuit when the potential at said another terminal is lower than said second potential, and
   a deactivating circuit for deactivating said control circuit when the potential at said another terminal of said MOS transistor becomes equal to or higher than said second potential even when the control signal is being input to said control circuit so as to allow to hold said MOS transistor to be non-conductive,
   wherein said power supply is an external power supply, said second potential is set to be slightly lower than the potential of an internal power supply and said control circuit is constituted by a CMOS current mirror circuit.

8. A MOS-type charging circuit according to claim 7 further including a constant current circuit for rendering a current flowing across said load circuit into a constant current when said MOS transistor turns on.

9. A MOS-type charging circuit according to claim 6, wherein said control circuit includes a conducting circuit for selectively conducting a terminal of a power supply having said second potential and said another terminal of said MOS transistor.

10. A MOS-type charging circuit including:
    a MOS transistor having a source terminal, a drain terminal and a gate terminal, one of the source and drain terminals connected to a power supply for supplying a first potential and another one of the source and drain terminals connected to a load circuit, and
    a control circuit connected to said another terminal and the gate terminal of the MOS transistor, wherein said control circuit is constituted by a differential amplifier and is activated by an input of a control signal thereto, for comparing a potential at said another terminal of said MOS transistor with a second potential which is lower than the first potential of said power supply, and for allowing said MOS transistor to be conductive so as to effect a charging of the load circuit when the potential at said another terminal is lower than said second potential, said control circuit including a low-level maintaining circuit for forcedly maintaining an output of said differential amplifier at low level for a fixed time through an input of the control signal thereto.

11. A MOS-type charging circuit according to claim 10, wherein said control circuit further includes a deactivating circuit for deactivating said control circuit when the potential at said another terminal of said MOS transistor becomes equal to or higher than said second potential even when the control signal is being input to said control circuit so as to allow to hold said MOS transistor to be non-conductive.

12. A MOS-type charging circuit according to claim 11, wherein said power supply is an external power supply, and said second potential is substantially equal to the potential of an internal power supply.

13. A MOS-type charging circuit including:
    a MOS transistor having a source terminal, a drain terminal and a gate terminal, one of the source and drain terminals connected to a power supply for supplying a first potential and another one of the source and drain terminals connected to a load circuit, and
    a control circuit connected to said another terminal and the gate terminal of the MOS transistor, wherein said control circuit is constituted by a differential amplifier and is activated by an input of a control signal thereto, for comparing a potential at said another terminal of said MOS transistor with a second potential which is lower than the first potential of said power supply, and for allowing said MOS transistor to be conductive so as to effect a charging of the load circuit when the potential at said another terminal is lower than said second potential, said control circuit including a low-level maintaining circuit for forcedly maintaining an output of said differential amplifier at low level for a fixed time through an input of the control signal thereto, wherein said power supply is an external power supply and said second potential is substantially equal to the potential of an internal power supply and said control circuit is constituted by a CMOS current mirror circuit.

14. A MOS-type charging circuit according to claim 10 further including a constant current circuit for rendering a current flowing across said load circuit into a constant current when said MOS transistor turns on.

15. A MOS-type charging circuit according to claim 11, wherein said control circuit includes a conducting circuit for selectively conducting a terminal having said second potential and said another terminal of said MOS transistor.

16. A MOS-type charging circuit according to claim 11, wherein said power supply is an external power supply, and said second potential is set to be slightly lower than the potential of an internal power supply.

17. A MOS-type charging circuit including:
    a MOS transistor having a source terminal, a drain terminal and a gate terminal, one of the source and drain terminals connected to a power supply for supplying a first potential and another one of the source and drain terminals connected to a load circuit, and
    a control circuit connected to said another terminal and the gate terminal to the MOS transistor, wherein said control circuit is constituted by a differential amplifier and is activated by an input of a control signal thereto, for comparing a potential at said another terminal of said MOS transistor with a second potential which is lower than the first potential of said first power supply, and for allowing said MOS transistor to be conductive so as to effect a charging of the load circuit when the potential at said another terminal is lower than said second potential, said control circuit including a low-level maintaining circuit for forcedly maintaining an output of said differential amplifier at low level for a fixed time through an input of the control signal thereto, wherein said control circuit further includes a deactivating circuit for deactivating said control circuit when the potential at said another terminal of said MOS transistor becomes equal to or higher than said second potential even when the control signal is being input to said control circuit so as to allow to hold said MOS transistor to be non-conductive, said power supply is an external power supply, and said second potential is set to be slightly lower than the potential of an internal power supply and wherein said control circuit is constituted by a CMOS current mirror circuit.

18. A MOS-type charging circuit according to claim 17 further including a constant current circuit for rendering a current flowing across said load circuit into a constant current when said MOS transistor turns on.

19. A MOS-type charging circuit according to claim 16, wherein said control circuit includes a conducting circuit for selectively conducting a terminal of a power supply having said second potential and said another terminal of said MOS transistor.

* * * * *